United States Patent
Yoo

(10) Patent No.: US 6,911,376 B2
(45) Date of Patent: Jun. 28, 2005

(54) SELECTIVE HEATING USING FLASH ANNEAL

(75) Inventor: Woo Sik Yoo, Palo Alto, CA (US)

(73) Assignee: WaferMasters, San Jose, CA (US)

( * ) Notice: Subject to any disclaimer, the term of this patent is extended or adjusted under 35 U.S.C. 154(b) by 0 days.

(21) Appl. No.: 10/677,512

(22) Filed: Oct. 1, 2003

(65) Prior Publication Data
US 2005/0074951 A1 Apr. 7, 2005

(51) Int. Cl.$^7$ ............................................. H01L 21/30
(52) U.S. Cl. ...................... 438/455; 438/458; 438/918; 438/967
(58) Field of Search .................. 438/378, 402, 438/407, 423, 455, 471, 476, 514, 517, 520, 528, 530, 795, 798, 918, 967, 149, 311, 458, 473–475, 477, 479, 480, 495, 496, 499, 406, 508, 509, 787, 788

(56) References Cited

U.S. PATENT DOCUMENTS

| | | | | |
|---|---|---|---|---|
| 5,141,894 A | * | 8/1992 | Bisaro et al. | 438/479 |
| 5,281,543 A | * | 1/1994 | Fukuzawa et al. | 438/186 |
| 6,211,041 B1 | * | 4/2001 | Ogura | 438/458 |
| 6,313,014 B1 | * | 11/2001 | Sakaguchi et al. | 438/475 |
| 6,806,170 B2 | * | 10/2004 | Ward et al. | 438/489 |

OTHER PUBLICATIONS

Stanley Wolf and Richard N. Tauber, Silicon Processing For The VLSI Era, 2000, Lattice Press, Second Edition, pp. 259–261.*

* cited by examiner

Primary Examiner—Lynne A. Gurley
Assistant Examiner—Stanetta Isaac
(74) Attorney, Agent, or Firm—MacPherson Kwok Chen & Heid LLP; Tom Chen

(57) ABSTRACT

A process, which includes implanting hydrogen ions into a silicon substrate, overlaying the silicon substrate on to a support substrate, and applying a flash anneal heat treatment to the silicon and support substrates to cause the silicon substrates to separate at a region defined by the implanted hydrogen ions.

15 Claims, 11 Drawing Sheets

SELECTIVE HEATING USING FLASH ANNEAL

BACKGROUND OF THE INVENTION

1. Field of the Invention

This invention generally relates to semiconductor manufacturing equipment and, more particularly, to a method of manufacturing a semiconductor device with a SOI structure.

2. Related Art

A silicon-on-insulator ("SOI") structure includes an active silicon layer on an electrically insulating silicon oxide layer. The creation of SOI wafers represents an intermediate step between the fabrication of the polished, bulk wafers and the creation of electronic components.

Semiconductor manufacturers can fabricate integrated circuits (ICs or chips) on the top layer of the SOI wafers using the same processes used on plain silicon wafers. The embedded layer of insulation enables the SOI-based chips to function at significantly higher speeds while reducing electrical losses. The result is an increase in performance and a reduction in power consumption.

Many methods have been provided related to the formation of an oxide layer on a surface of a silicon substrate. One such method, known as a hydrogen ion separation process, is described below with reference to FIGS. 1A–1F.

As illustrated in FIGS. 1A and 1B, a silicon substrate 100 and a support substrate 102 are provided. A silicon dioxide ($SiO_2$) layer 104 is grown or otherwise formed on silicon substrate 100 to create an insulating film. Generally, $SiO_2$ layer 104 is formed to have a thickness required for fabrication of a device on an SOI substrate.

FIG. 1C illustrates a hydrogen implantation 106 into silicon substrate 100 through $SiO_2$ layer 104. The implanted hydrogen ions break bonds between silicon atoms in the silicon crystal, and terminates non-bonded bands of silicon atoms.

As illustrated in FIG. 1D, in the next step of the process, silicon substrate 100 is turned upside down and laid on top of support substrate 102 so that the surface of silicon substrate 100 nearest to hydrogen implantation 106 is in direct contact with support substrate 102. Thereafter, silicon substrate 100 and support substrate 102 are bonded together at the contacting surfaces to form a combined structure 108. Once the combined structure 108 is complete, it is subjected to a relatively low temperature heat treatment in the range of about 300° C. to about 800° C.

As the temperature rises hydrogen implantation 106 is agglomerated at a plane defined at the depth of hydrogen implantation 106, which is parallel to a surface of silicon substrate 100. As shown in FIG. 1E, since support substrate 102 makes close contact with silicon substrate 100 with $SiO_2$ layer 104 sandwiched therebetween, silicon substrate 100 is separated into two pieces partially due to the force of deformation caused by a difference in the thermal expansion coefficient between support substrate 102, and $SiO_2$ layer 104 and partially due to the agglomeration of hydrogen implantation 106. In the separation of silicon substrate 100, one separated piece remains silicon substrate 100 and the other piece 109 remains bonded to support substrate 102 with $SiO_2$ layer 104 therebetween. The separated piece acts as an SOI active layer 110.

As shown in FIG. 1F, the completed SOI substrate 112, including the SOI active layer 110 can be subjected to a second heat treatment at a relatively high temperature, specifically, at about 1000° C. or greater. The second heat treatment is provided to enhance and ensure that an efficient bonding force is applied between support substrate 100 and $SiO_2$ layer 104.

Unfortunately, the force of deformation caused by the difference in the thermal expansion coefficient of support substrate 102 and $SiO_2$ layer 104 can subject the SOI structure to stresses which cause the structure to break, shatter or become otherwise unusable.

Increasing the time for conducting heat treatments may help to reduce the stress effects, however, processing times are already approaching unreasonable durations. For example, for a bonded together $SiO_2$ layered substrate and a support substrate subjected to a heat treatment at 800° C., the heat treatment lasts for about 10 minutes. When the heat treatment is carried out at 300° C., the heat treatment time extends to about 24 hours.

When support substrates are made of different materials from the silicon substrate, such as in a silicon-on-quartz (SOQ) substrate or other silicon-on-foreign (SOF) substrate, the need to lower heat treatment temperatures increases, since the effect of the difference of the thermal expansion coefficient of the different materials becomes more pronounced.

What is needed is a method for heat treating SOI structures with varying types of support substrates without causing breakage of the SOI structure or requiring slow production rates.

SUMMARY

The present invention provides a method for producing SOI wafers, including SOQ and SOF wafers. The wafers can be made with less breakage and at a faster production rate so that higher volume production can be achieved.

The present invention provides a process, which includes implanting hydrogen ions into a silicon substrate, overlaying the silicon substrate on to a support substrate, and applying a high intensity resultant energy to the hydrogen implant region of the support substrate to cause the silicon and support substrates to separate at a plane defined by the implanted hydrogen ions.

In accordance with the present invention the resultant energy is provided at a high intensity such that only a short exposure time is necessary to heat the region defined by the implanted hydrogen ions to a temperature required to cause separation. The heat treatment, referred to as a "flash" anneal process, may be accomplished using an energy source, which provides the resultant energy output, as seen by the SOI wafer, substantially free of non-uniformities. Beneficially, the resultant energy can be uniformly disposed over the support substrate surface to permeate through the support substrate and heat only the active layer of the bonded silicon substrate surface. Because the resultant energy is uniform over the diameter of the substrate there is no significant heating overlap.

Typical, heat treatments of SOI wafers have required heating of the entire bulk SOI wafer. The selective heating of primarily just the region defined by the implanted hydrogen ions of the silicon substrate allows for causing the agglomeration of the hydrogen implantation without creating stresses due to inconsistent thermal expansion coefficients of the substrate materials, thus avoiding causing the destruction of the SOI wafer. Since the flash anneal process is substantially instantaneous, the production time is increased as well.

Beneficially, the present invention removes design considerations related to using materials with different thermal expansion coefficients, since the bulk of the SOI wafer is not substantially heated. Accordingly, many types of support substrates may be used, such as quartz, SiC, GaAs, GaP, InP, GaN, $Al_2O_3$ and other foreign material substrates.

These and other features and advantages of the present invention will be more readily apparent from the detailed description of the embodiments set forth below taken in conjunction with the accompanying drawings.

BRIEF DESCRIPTION OF THE FIGURES

FIGS. 2A to 2D are simplified cross-sectional views illustrating respective steps of a method of fabricating a wafer in accordance with the present invention;

DETAILED DESCRIPTION

As used herein, the word "flash" includes it ordinary meaning as generally understood by those of ordinary skill in the art. This definition includes the definition that flash means to give off light energy suddenly or substantially instantaneous (or in transient bursts) for a duration of time between about 1 nanosecond and about 10 seconds.

Figure 3:
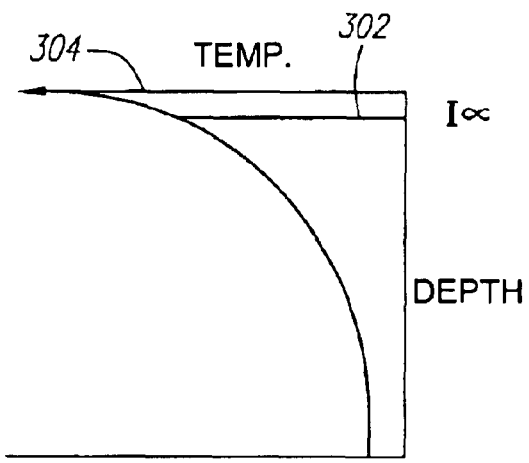
FIG. 3 is a simplified illustration of the active layer of a wafer in accordance with principles of the present invention.

The active layer of a portion of a semiconductor wafer is well known in the semiconductor manufacturing industry as that portion of the wafer in which semiconductor devices are formed, such as transistors, diodes, resistors, and capacitors. For example, referring to FIG. 3, active layer 302 extends from surface 304 of a wafer down to a depth α below surface 304. In this example, with no intent to be limiting, the depth α is typically between about 0.05 µm and 1 mm, but will vary with the process and device feature size.

Figure 1A:
FIGS. 1A to 1F are simplified cross-sectional views illustrating respective steps of a method of fabricating an SOI substrate by a hydrogen ion separation process.
Figure 1B:
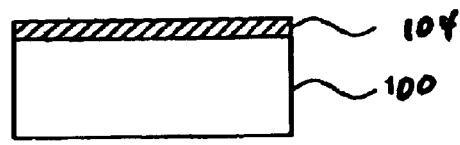
Figure 1C:
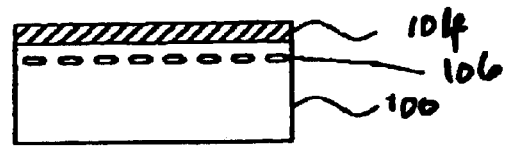
Figure 1D:
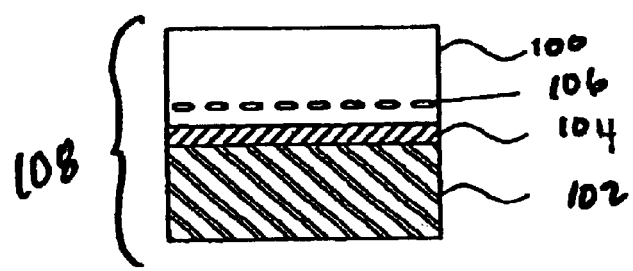
Figure 1E:
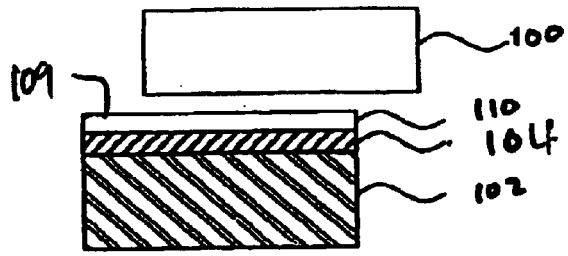
Figure 1F:
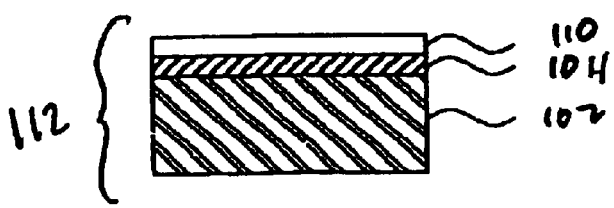
Figure 2A:
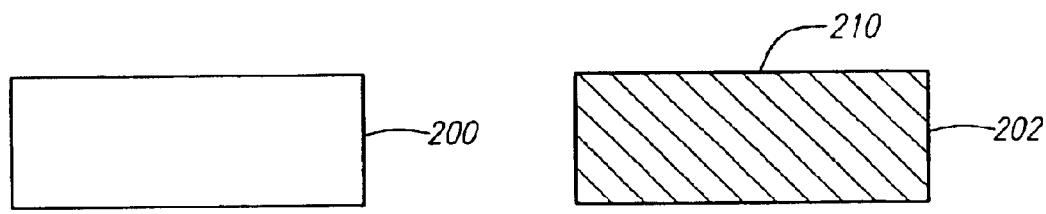

FIGS. 2A to 2D are simplified cross-sectional views illustrating respective steps of a method of fabricating a wafer in accordance with an embodiment of the present invention. As illustrated in FIG. 2A, two substrates are provided, a silicon substrate 200 and a support substrate 202. Silicon substrate 200 can be any type of silicon substrate including substrates containing oxygen. Silicon substrate 200 can be fabricated by well known processes, such as Float Zone (FZ) and Magnetic Chochralski (MCZ) processes.

Support substrate 202, may include any type of silicon wafer or other foreign substrate material. In one embodiment, support substrate 202 may include a glass capable of withstanding high temperatures in the range of 800° C. or greater, such as quartz, sapphire, SiC, and diamond. A SOI substrate or wafer, which uses a form of glass as the support substrate can be referred to as silicon-on-quartz (SOQ) substrate or wafer. In other embodiments, support substrate 202 can include other foreign materials, such as, GaAs, GaP, InP, GaN, and $Al_2O_3$ and is referred to as a silicon-on-foreign (SOF) substrates or wafers. Optionally, support substrate 202 may have a $SiO_2$ layer formed on a surface thereof.

With the exception of specific distinguishing references to SOQ or SOF substrates and wafers, all references to SOI substrates and SOI wafers shall apply equally to SOQ substrates, SOQ wafers, SOF substrates and SOF wafers.

As shown in FIG. 2B, a $SiO_2$ layer 204 is formed on a surface of silicon substrate 200 using well known techniques, such as thermal oxidation, to provide an insulating layer. $SiO_2$ layer 204 provides the function of a buried oxide film generally required for fabrication of an electronic device on a substrate. Thus, the thickness of $SiO_2$ layer 204 should be made adequate to provide this function. For example, the thickness of $SiO_2$ layer 204 is between about 10 Å and about 5000 Å.

After $SiO_2$ layer 204 has been formed, hydrogen is ion-implanted into surface 208 of silicon substrate 200 through $SiO_2$ layer 204. The hydrogen ion-implantation 206 is made at a desired depth into silicon substrate 200. The depth for hydrogen implantation 206 is the depth at which silicon substrate 200 separates when subjected to heat treatment. Thus, as described in more detail below, the piece of the separated silicon substrate 200 that remains with $SiO_2$ layer 204, shall become an SOI active layer 302 (FIG. 3) in the resulting SOI structure. Accordingly, the depth of ion implantation 206, which is a function of the acceleration energy of the implanted ions, can be controlled to ensure that the SOI active layer has a desired thickness. In one embodiment, silicon substrate 200 is implanted at about 30–200 KeV with doses of about $1 \times 10^{16}$ H$^+$cm$^{-2}$ to about $3 \times 10^{17}$ H$^+$cm$^{-2}$.

In an alternative embodiment, ions of different gases, such as helium ions, may be implanted into silicon substrate 200 along with hydrogen ions to facilitate separation of silicon substrate 200.

Referring again to FIG. 2D, to bury $SiO_2$ layer 204 between silicon substrate 200 and support substrate 202, silicon substrate 200 is turned over and laid on top of support substrate 202, such that surface 208 of silicon substrate 200 makes direct contact with surface 210 of support substrate 202. Typically, a chemical bond material is used to bond the silicon and support substrates together to form SOI structure 212.

Figure 2D:
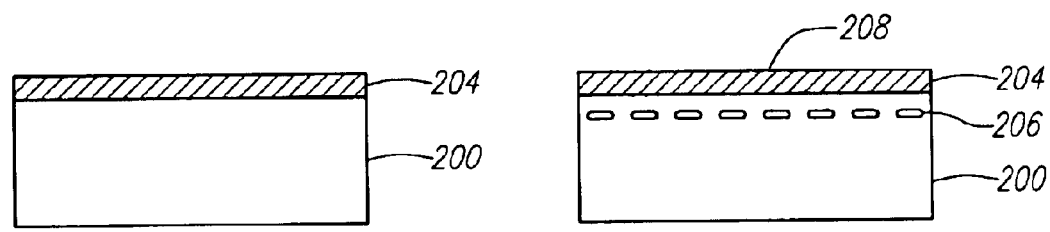
Figure 2D:
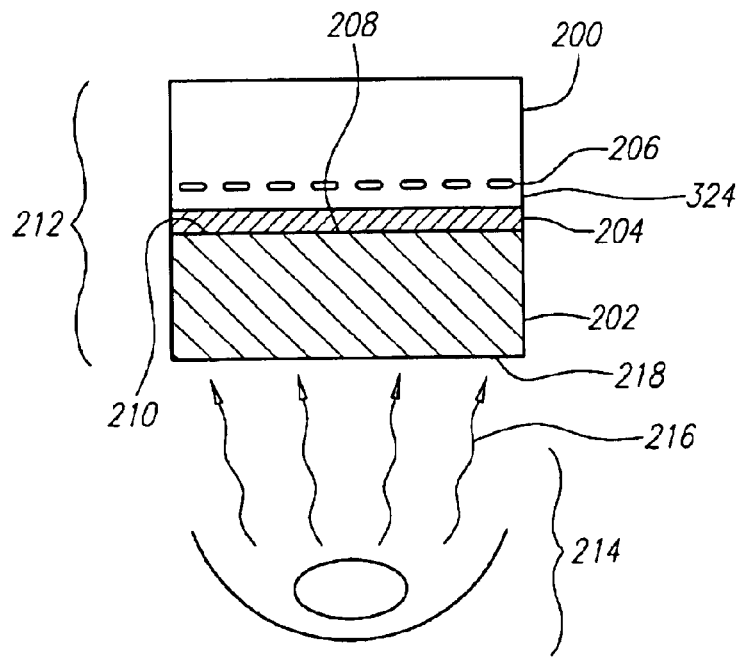

FIG. 2D shows a simplified illustration of an embodiment of a flash anneal assembly 214 in accordance with the present invention. Flash anneal assembly 214 is used to provide a heat treatment to SOI structure 212. In this embodiment, flash anneal assembly 214 is positioned proximate to SOI structure 212, such that radiation energy 216 emitted from flash anneal assembly 214 can impinge on SOI structure 212, specifically through surface 218 on support substrate 202. As described in detail below, radiation energy 216 heats hydrogen ion-implantation 206 to a temperature required to cause silicon substrate 200 to separate.

Figure 5A:
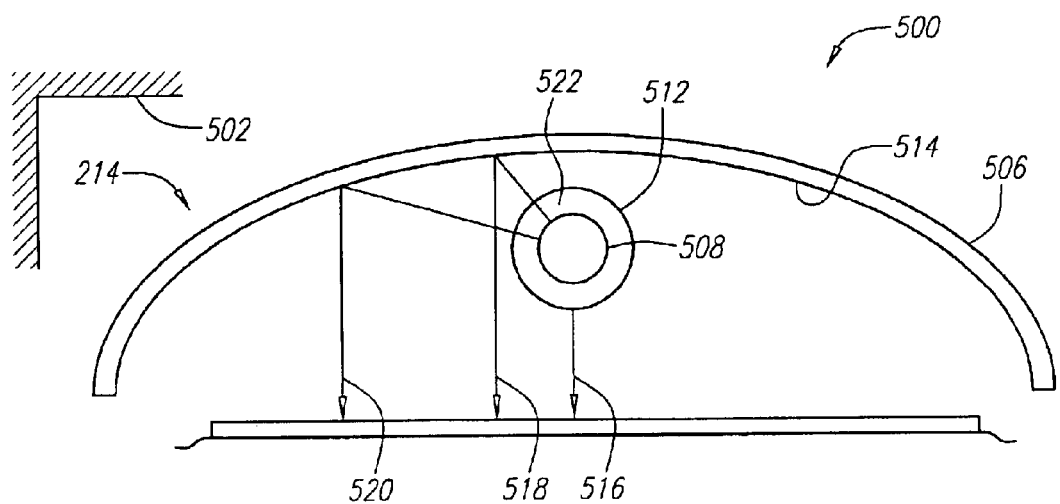
FIGS. 5A and 5B are simplified illustrations of an embodiment of a flash anneal apparatus in accordance with the present invention.
Figure 5B:
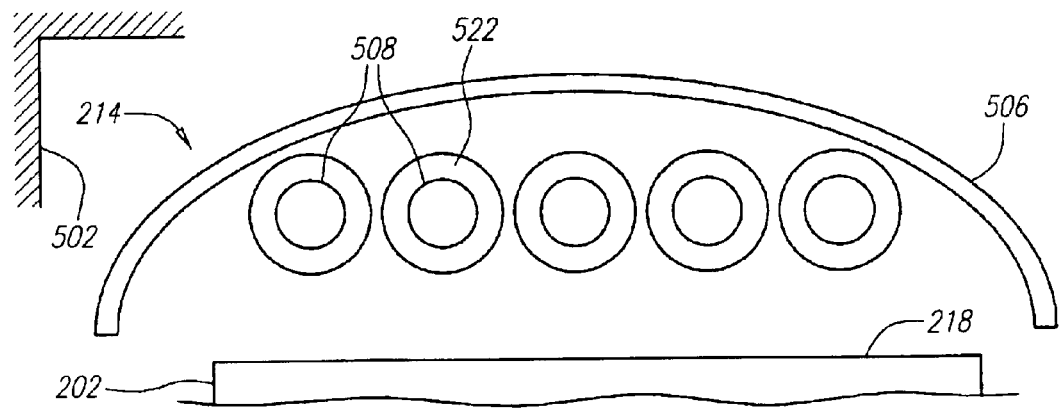

Referring now to FIGS. 5A and 5B, in one embodiment, to create SOI structure 212, the structure is positioned in a process chamber 502, which includes flash anneal assembly 214. In one embodiment, flash anneal assembly 214 may include a reflector 506 and a radiation energy source 508.

Flash anneal assembly 214 may be positioned within process chamber 502 proximate to a surface 218 of support substrate 202, such that in operation, flash anneal assembly 214 can be made to heat the ion implantation 206 region of silicon substrate 200 through the bulk of support substrate 202 using the radiation energy emitted from radiation source 508.

In one embodiment, radiation energy source 508 can be a high-intensity lamp of the type conventionally used in lamp heating operations. In this embodiment, radiation energy source 508 is a filament-less lamp, such as a Xe arc lamp (hereinafter "lamp 508"). Lamp 508 can be any suitably shaped lamp, for example, a cylindrical tube shaped lamp that has a length at least as long as the diameter of surface 218 of support substrate 202. While FIG. 5A is a simplified illustration of an embodiment, in which a single lamp is shown disposed proximate to reflector 506, it should be understood that any number of lamps 508 can be used, as shown in FIG. 5B, to achieve the desired heating levels required of a specific process.

In one embodiment, lamp 508 can be surrounded by a flow tube 512. Flow tube 512 can contain a cooling fluid 522, for example, deionized water. Cooling fluid 522 is used to keep lamp 508 from overheating during operation. For example, cooling fluid can keep the temperature of lamp 508 under 100° C. to keep any quartz components of lamp 508 from melting. In another embodiment, cooling fluid 522 can be mixed with a non-conductive die. The non-conductive die can act as a filter to keep only certain wavelengths from emanating from lamp 508 through flow tube 512.

Referring again to FIG. 5A, flash anneal assembly 214 is in operational arrangement with surface 218 of support substrate 202. Reflector 506 includes an inner surface 514, which can be highly reflective of certain wavelengths and absorptive or non-reflective of others. In one embodiment, inner surface 514 can be coated with a material, which has the reflecting/absorbing characteristic. For example, inner surface 514 may be coated with gold or silver, where the silver is further coated with a protection coating, such as SiN or any transparent coating, which prohibits oxidation of the silver. The coating efficiently reflects wavelengths of less than 900 nm, to produce an average wavelength of between about 900 nm and about 200 nm. In another embodiment, inner surface is highly reflective across the full spectra of ultra violet (UV), infrared (IR) and visible wavelengths.

In one embodiment, the wavelength of light energy passing through support substrate 202 can be tailored so that some level of effective energy can pass through to ion implantation 206 regardless of the material composition of support substrate 202. For example, if support substrate is made of silicon, then the wavelength of the light energy made to impinge on support substrate 202 may be tailored to be in the range of 250 nm to 1 $\mu$m, which can penetrate the silicon. Similarly, if support substrate is made of quartz the wavelength of the light energy can be tailored to include a larger spectrum of effective wavelengths, such as between 400 nm and 2 $\mu$m. A support substrate of another material can be bombarded with light energy that has similarly been tailored to penetrate the material thereof. In each embodiment, the flash of radiation energy can cause about 0.5 J/cm$^2$ to about 100 J/cm$^2$ to be concentrated at ion implantation region 206.

To facilitate the concentration of energy at ion implantation 206, reflector 506 may be formed into any suitable geometric shape. For example, reflector 506 may be flat, spherical, elliptical or parabolic. The light energy from lamp 508 can be focused at the center or focal point of reflector 506 to be directed toward surface 218 of support substrate 202. The radiation emitted from lamp 508 and reflected from inner surface 514 of reflector 506 impinges on surface 218 of support substrate 202, as simply and representatively illustrated by rays 516, 518 and 520, to provide a uniform temperature distribution across the surface of surface 218 of support substrate 202, which heats the ion implantation 206.

Figure 12A:
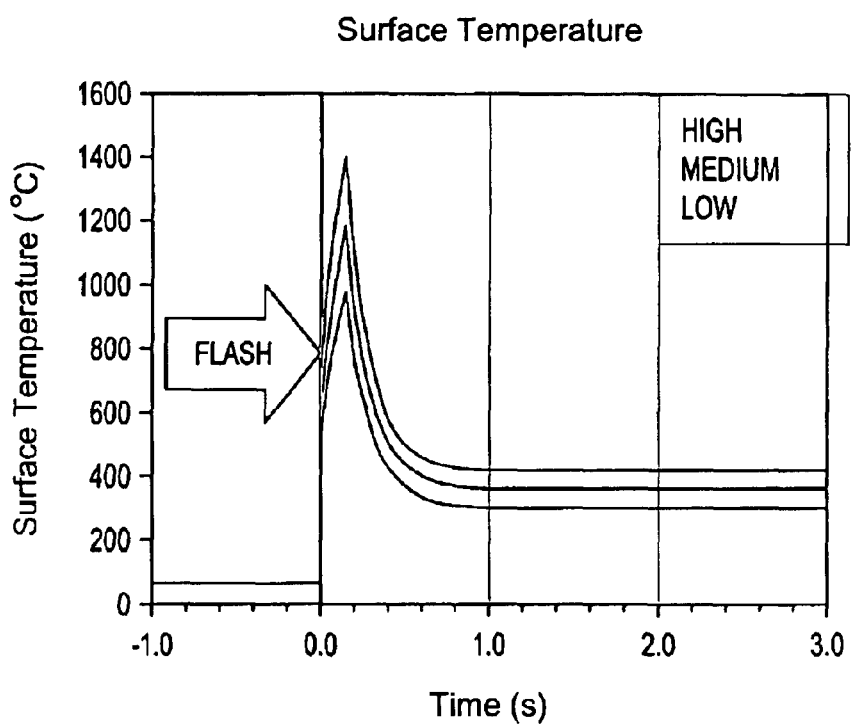
FIG. 12A is a FIG. 12A is a graphical representation of the surface temperature of the wafer as a function of time in accordance with one embodiment of the present invention.

The temperature to which ion implantation 206 is heated is a function of the relationship between the power supplied to lamp 508 and the length of time which the radiation energy is allowed to impinge on surface 218 of support substrate 202. As shown in FIG. 12A, in one embodiment, the temperature of ion implantation 206 may be raised to an annealing temperature in the range from between about 500° C. (low) to about 1400° C. (high). To achieve these temperatures, the wafer is exposed to a flash in accordance with the present invention, which provides light energy suddenly or substantially instantaneously, for example, for a duration of time between about 1 nanosecond and about 10 seconds, for example, less than 1 second. The power level can range from between about 0.5 J/cm$^2$ and about 100 J/cm$^2$.

Figure 12B:
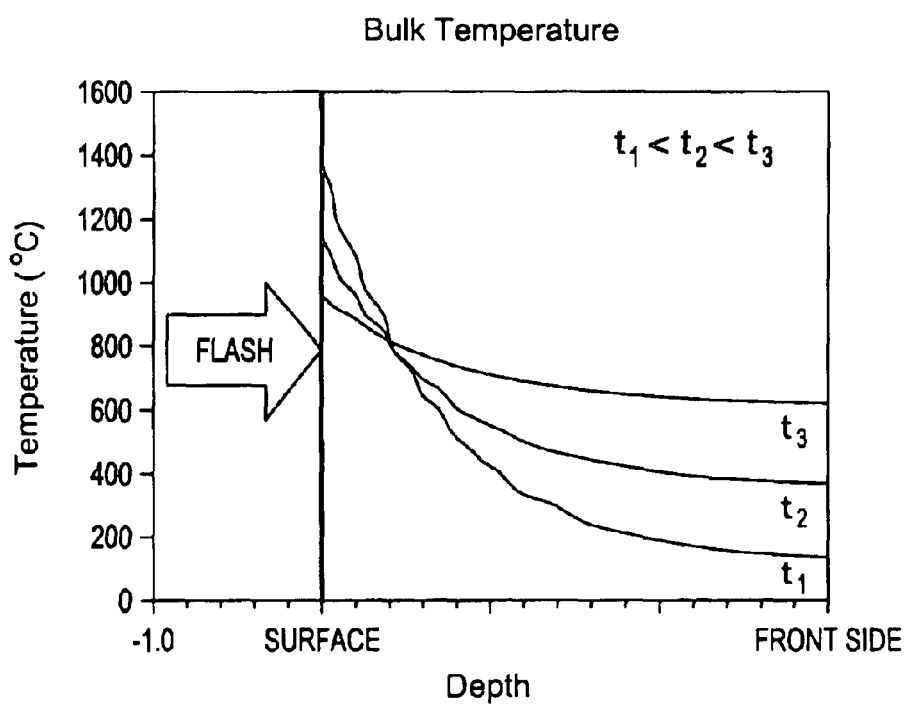
FIG. 12B, is a graphical representation of the bulk temperature of the wafer as a function of the increase in depth towards the opposing surface in accordance with one embodiment of the present invention.

As illustrated in the graph shown in FIG. 12B, the bulk temperature of the wafer diminishes as a function of the increase in depth towards the opposing surface. Beneficially, the flash anneal process described above substantially heats only the ion implantation 206 to the desired temperature, thus protecting the remaining silicon substrate 200 from experiencing significant thermal expansion before separation of the substrates 200 and 202.

Figure 4A:
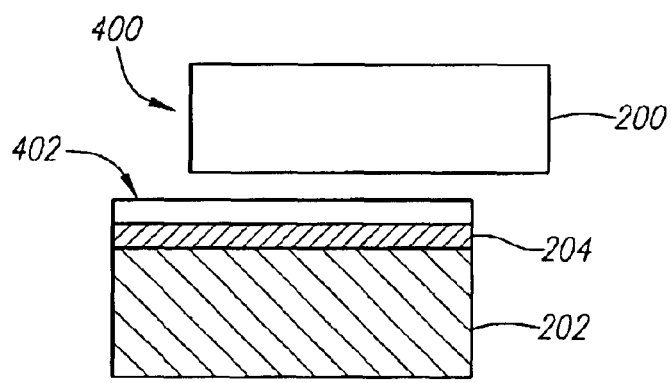
FIGS. 4A and 4B are simplified cross-sectional views illustrating respective steps of a method of fabricating a wafer in accordance with the present invention.
Figure 4B:
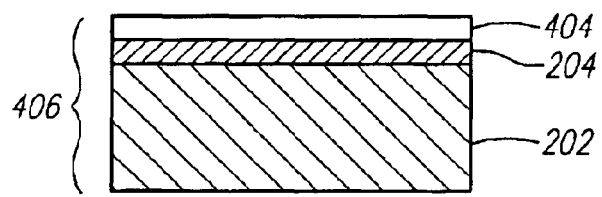

FIGS. 4A and 4B are simplified cross-sectional views representing additional steps in the SOI structure formation in accordance with the present invention. Once the flash anneal process raises the temperature of the ion implantation region to the desired temperature, silicon substrate 200 separates at a region defined by the depth of ion implantation 206 thereby creating a first piece 400 and a second piece 402.

First piece 400 represents a remainder of the original silicon substrate 200. Second piece 402 is a portion of original silicon substrate 200 which remains bonded to support substrate 202 having SiO$_2$ layer 204 sandwiched therebetween. As shown in FIG. 4B, second piece 402 becomes active layer 404 of SOI structure 406.

Advantageously, the flash anneal allows for the heating of ion implantation 206 without significantly heating the bulk of structure 212 (FIG. 2D). Thus, adverse effects that would otherwise be attributed to the heating of the entire structure 212 are avoided. Accordingly, materials can be bonded to silicon substrates, for example quartz, which forms SOQ without causing the destruction of the SOI structure. For the same reasons, a wide range of other materials, such as SiC, GaAs, GaP, InP, GaN, and $Al_2O_3$ may also be bonded to silicon substrates to form SOF structures.

Figure 6:
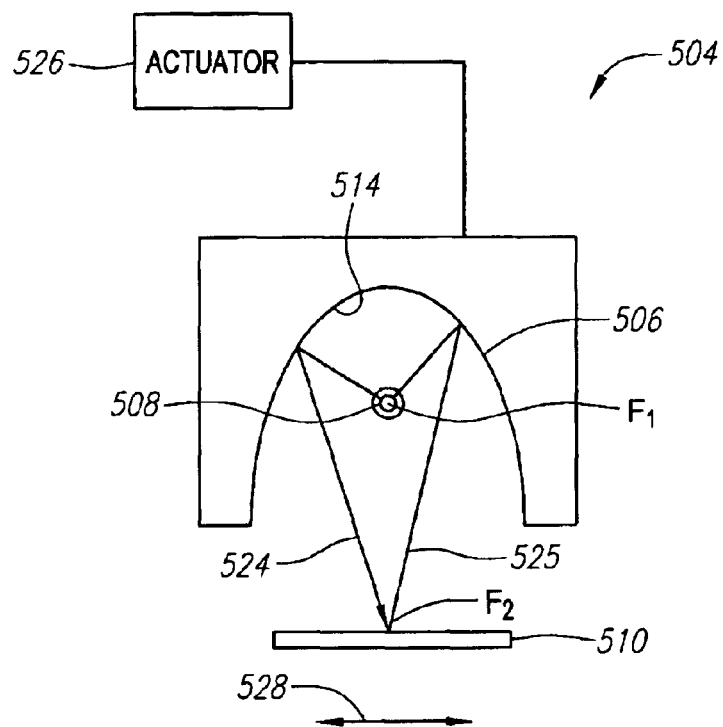
FIG. 6 is a simplified illustration of a flash anneal apparatus using the reflector assembly of FIGS. 5A and 5B in accordance with the present invention.

Other embodiments of flash anneal assembly 214 can be used interchangeably in the present invention to provide the flash anneal. For example, FIG. 6 is a simplified illustration of an alternative embodiment of flash anneal assembly 214. In this alternative embodiment, reflector 506 may be formed into an ellipse, which has two focal points $F_1$ and $F_2$. Lamp 508 can be positioned at focal point $F_1$, such that the energy is reflected from inner surface 514, exemplified by rays 524 and 525, and focused at the second focal point $F_2$. Surface 218 of support substrate 202 can be positioned at focal point $F_2$, such that the energy can be used to impinge on surface 218 of support substrate 202.

In this embodiment, the entire wafer surface can be subjected to the energy focused at $F_2$, by moving surface 218 of support substrate 202 relative to focal point $F_2$. For example, actuator 526 can be used to provide a conventional means for causing flash anneal assembly 214 to scan over surface 218 of support substrate 202. Actuator 526 may be configured to move either surface 218 of support substrate 202 or flash anneal assembly 214 to provide a back and forth scanning motion, as indicated by arrow 528, across surface 218 of support substrate 202.

Figure 7:
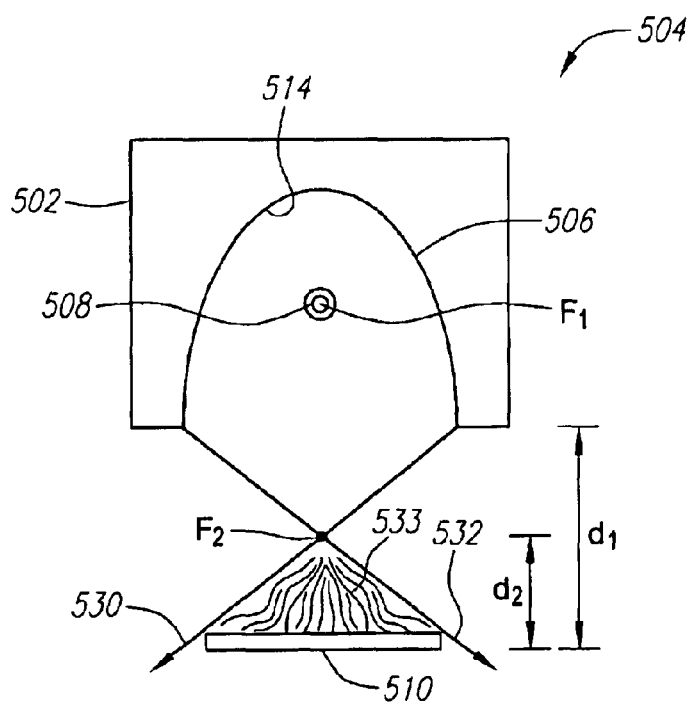
FIG. 7 is a simplified illustration of an alternative embodiment of the reflector assembly of FIG. 6 in accordance with the present invention.

FIG. 7 is a simplified illustration of another embodiment of flash anneal assembly 214 in accordance with the present invention. In this embodiment, reflector 506 is formed into an ellipse, with two focal points $F_1$ and $F_2$. Lamp 508 is positioned at focal point $F_1$, such that the energy is reflected from inner surface 514 and focused at focal point $F_2$. In this embodiment, surface 218 of support substrate 202 is set back a distance $d_1$ from flash anneal assembly 214 and/or a distance $d_2$ from focal point $F_2$. Distances $d_1$ and $d_2$ are selected such that surface 218 of support substrate 202 is fully engulfed within a radiation beam 533 emanating from focal point $F_2$. Beam 533, outlined by rays 530 and 532, covers the entire surface area of surface 218 of support substrate 202, such that the entire surface of surface 218 of support substrate 202 is subjected simultaneously to substantially all of the reflected energy from lamp 508 to impinge on surface 218 of support substrate 202 and heat ion implantation 206.

Figure 8:
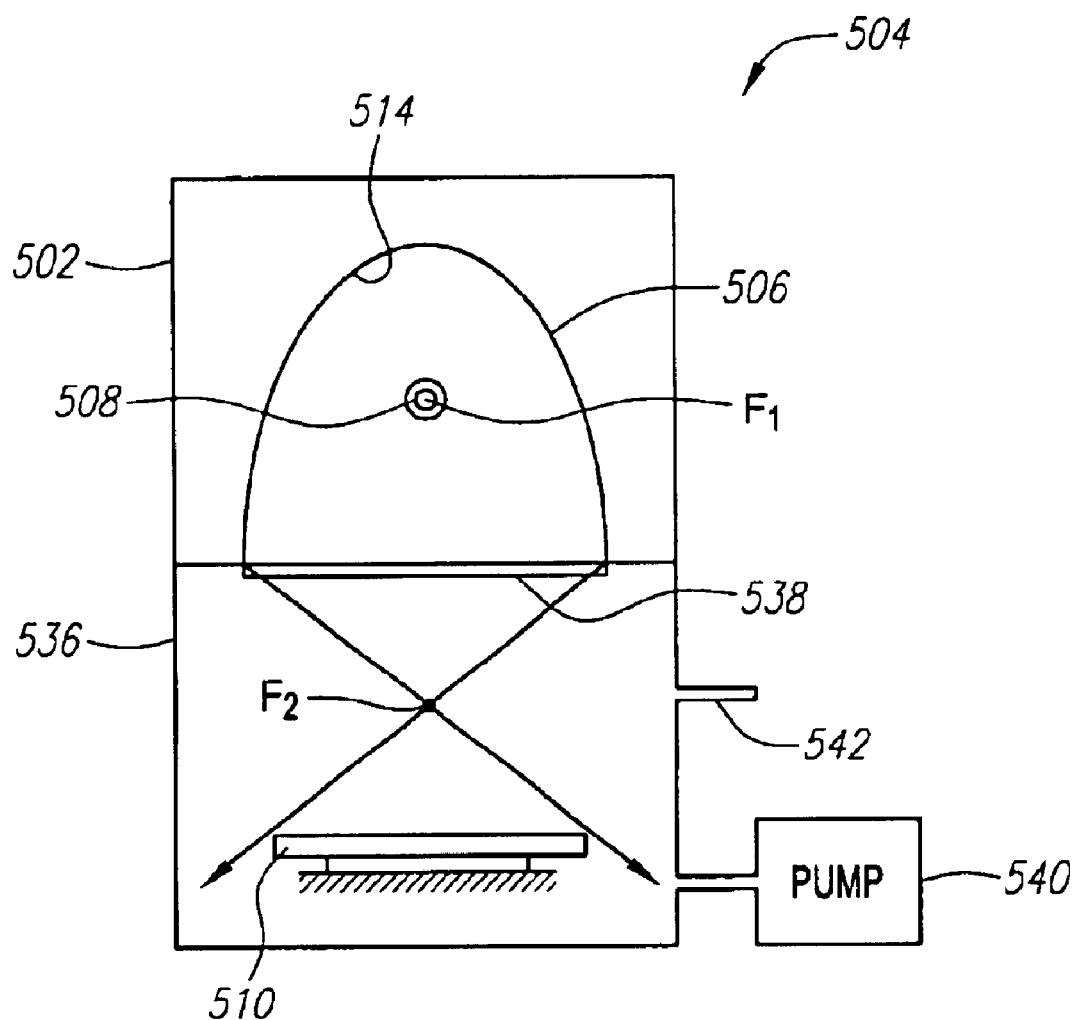
FIG. 8 is a simplified illustration of an alternative embodiment of the reflector assembly of FIG. 6 in accordance with the present invention.

FIG. 8 is a simplified illustration of yet another embodiment of flash anneal assembly 214 in accordance with the present invention. In this embodiment, process chamber 502 including flash anneal assembly 214 may be mounted external to a second process chamber 536. Flash anneal assembly 214 can be positioned above an optical window 538, which is provided between chambers 502 and 536 to allow the radiation energy emitted from lamp 508 to enter second process chamber 536 and impinge on surface 218 of support substrate 202. Optical window 538 may be made of any material that allows for the transmission of the radiation energy, for example, quartz. Window 538 may have a thickness of between about 1 mm and about 5 mm and a diameter that is at least as great as or greater than surface 218 of support substrate 202.

Second process chamber 536 can be pulled to vacuum, for example, using a pump 540. Second chamber 536 can also be filled through inlet 542 with a non-oxygen gas, such as $N_2$. During the processing of surface 218 of support substrate 202, the vacuum or non-oxygen environment ensures that the transmission of ultra-violet (UV) wavelengths from lamp 508 can reach surface 218 of support substrate 202 heat ion implantation 206.

Although second process chamber 536 with quartz window 538 has been illustrated using the embodiment of flash anneal assembly 214 of FIG. 7, the second process chamber 536 and quartz window 538 can be used with all of the embodiments of flash anneal assembly 214 described herein. It should also be understood that chambers 502 and 536 may be a single chamber.

Figure 9A:
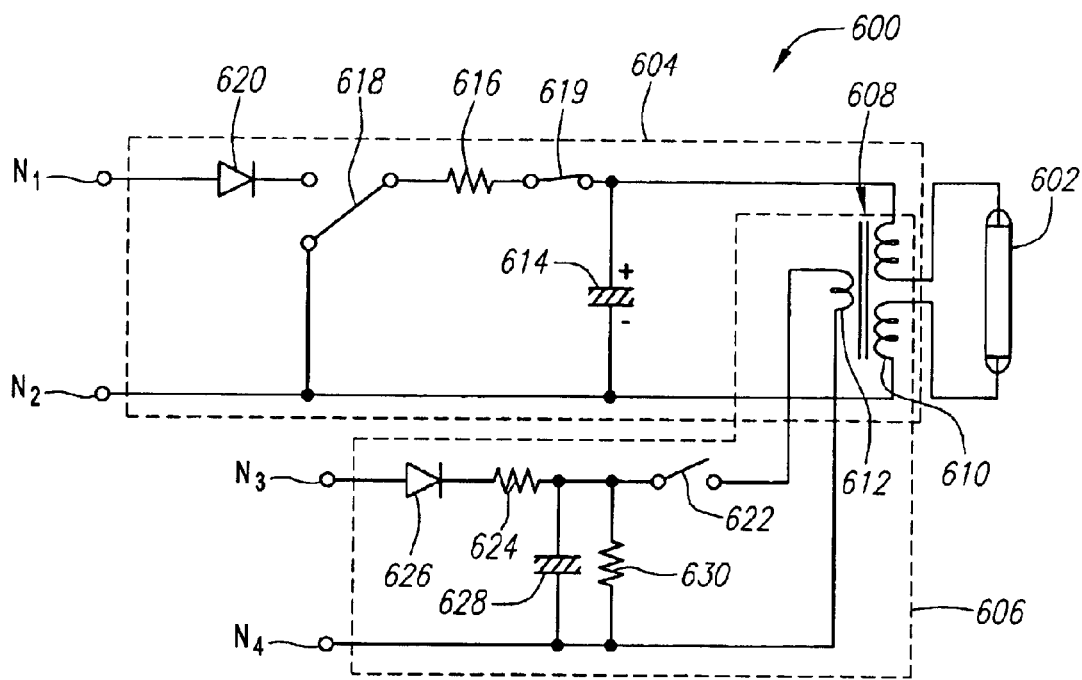
FIGS. 9A–9D are simplified circuit diagrams of a power supply to ignite a lamp in accordance with an embodiment of the present invention.

FIGS. 9A–9D are simplified circuit diagrams of a power supply 600 for a lamp 602 in accordance with an embodiment of the present invention. As shown in FIG. 9A, power supply 600 includes a main circuit 604 and an ignition circuit 606. In one embodiment, main circuit 604 includes an ignition transformer 608 whose primary winding 610 can be supplied with a voltage $V_1$, and whose secondary winding 612 ignites lamp 602 with the stepped-up value of voltage $V_1$. In this embodiment, a capacitor 614 is provided in parallel to a series connection of primary winding 610 and a controllable switch 618. Capacitor 614 can be of any desired capacitance, for example, between about 10 $\mu F$ and 100 F. Switch 618 can be, for example, any suitable manual switch, electromagnetic relay or solid state device.

In this embodiment, capacitor 614 can be connected in parallel with a resistor 616 and a diode 620 provided in series with resistor 616. When charging capacitor 614, resistor 616 acts as a current limiter and/or a dummy load. Capacitor 614 is charged when supply voltage $V_1$ is activated across nodes $N_1$ and $N_2$. Voltage $V_1$ can be an AC voltage supplied via a direct line or a transformer output. Voltage $V_1$ can be adjustable and may range from between about 200 VAC and 5000 VAC.

Ignition circuit 606 supplies the ignition energy with the aid of a pulse switch 622. For this purpose, ignition circuit 606 is provided with secondary winding 612 of ignition transformer 608. A resistor 624, in series with diode 626, is provided in series with secondary winding 612 and pulse switch 622. A capacitor 628, disposed in parallel to a shunt resistor 630, is in series connection to secondary winding 612. Capacitor 628 can be of any desired capacitance, for example, between about 0.1 $\mu F$ and 100 $\mu F$. Capacitor 628 can be charged by a voltage $V_2$, placed across nodes $N_3$ and $N_4$. Voltage $V_2$ can be an AC voltage supplied via a direct line or a transformer output. Voltage $V_2$ can be adjustable and may range from between about 200 VAC and 1000 VAC. Alternatively, for simplicity, nodes $N_1$ and $N_2$ can be electrically coupled to nodes $N_3$ and $N_4$ so as to share the same power source.

Figure 9B:
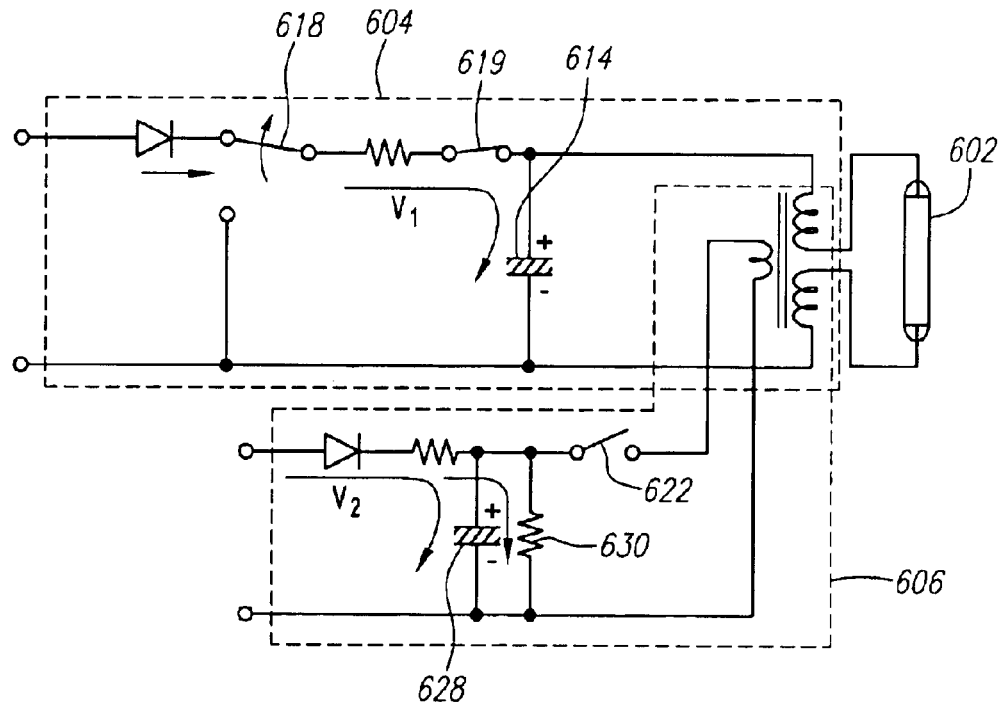

FIG. 9B shows an embodiment of primary circuit 604 and ignition circuit 606 where switches 618 and 619 are closed to allow supply voltage $V_1$ to be applied between nodes $N_1$ and $N_2$, to begin the charging via resistor 616 of capacitor 614. At the same time, capacitor 628 of ignition circuit 606 is charged via resistor 624 with voltage $V_2$ applied between nodes $N_3$ and $N_4$.

Figure 9C:
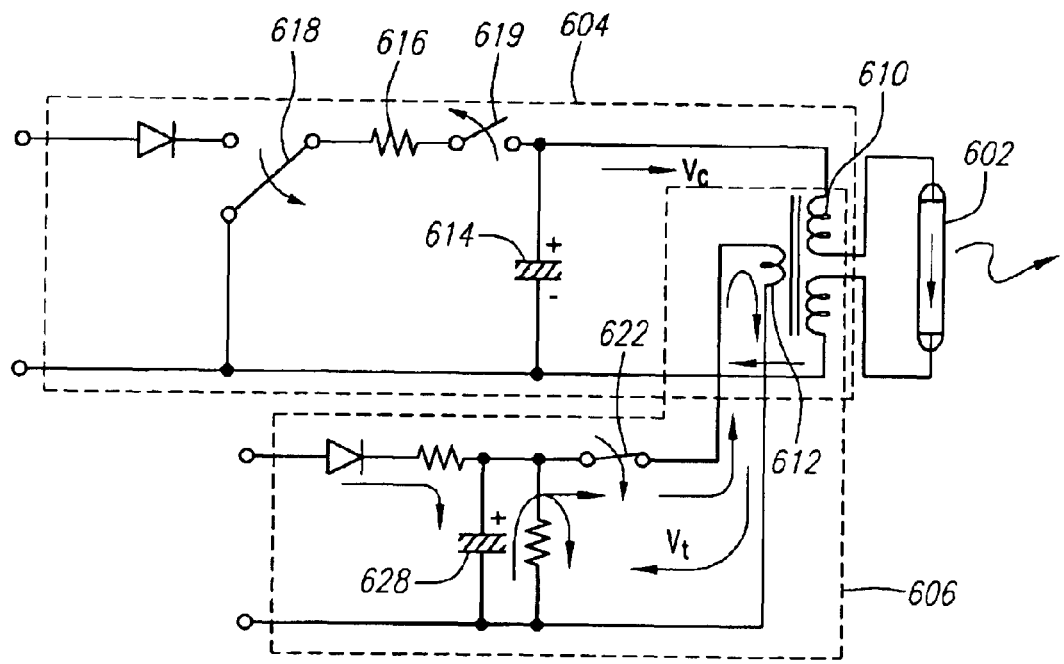

FIG. 9C shows an embodiment, such that when capacitor 614 is charged to a desired capacity, switch 618 can be opened and switch 619 can be opened, thus removing the effect of supply voltage $V_1$ on capacitor 614 and allowing a voltage $V_c$ to be supplied from capacitor 614 across primary windings 610. Impulse switch 622 can be closed to allow capacitor 628 to discharge, such that a voltage $V_t$ is supplied across secondary windings 612. According to the transmission ratio of ignition transformer 608, a current flux generates a stepped-up voltage in primary windings 610 that is high enough to energize lamp 602.

Figure 9D:
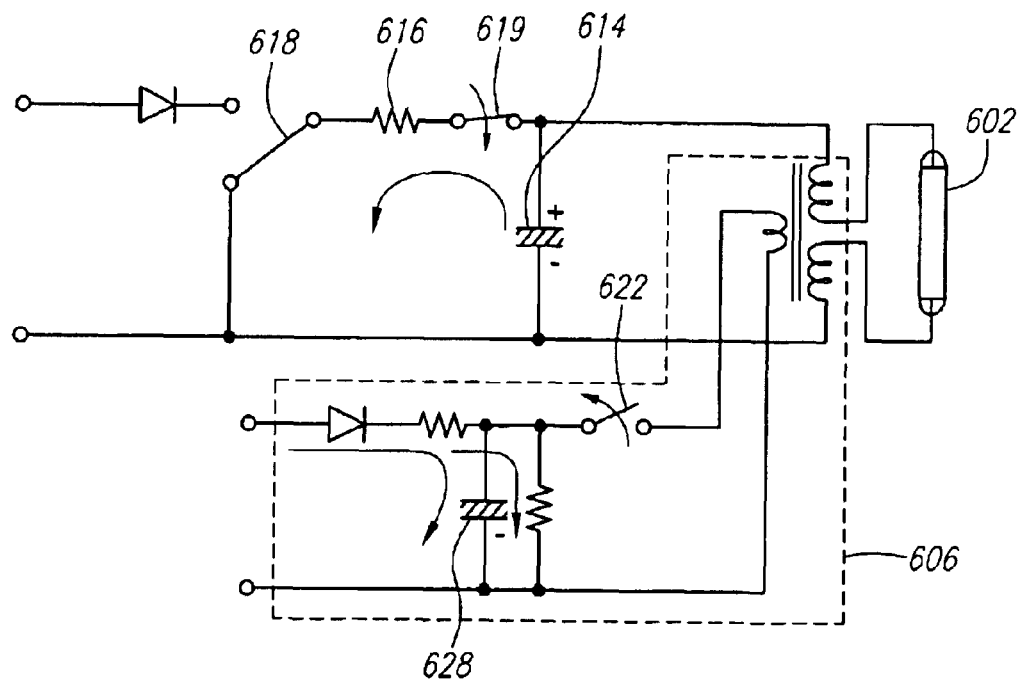

As shown in FIG. 9D, once lamp 602 has been energized as desired, switch 622 can be released (i.e. opened) and switch 619 can be closed to allow capacitor 614 to continue to discharge via the dummy load supplied through resistor 616. In this configuration, capacitor 628 of ignition circuit 606 begins to be recharged once switch 622 is opened. Primary circuit 604 can be re-charged with the closing of switch 618.

Figure 10:
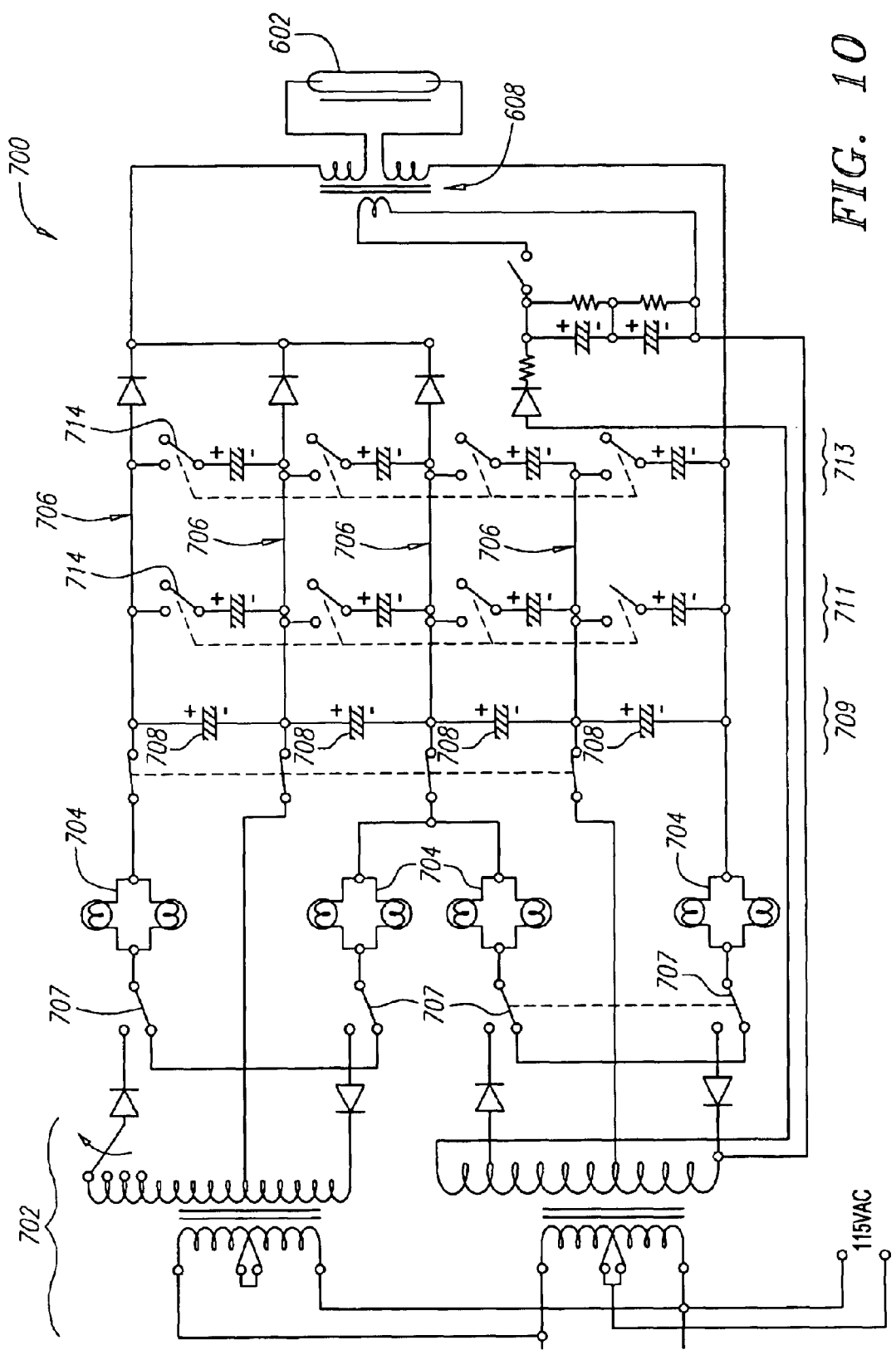
FIG. 10 is an embodiment of a power supply circuit in accordance with the principles of the present invention.

FIG. 10 is an embodiment of a power supply circuit 700 configured using the principles described in reference to FIGS. 9A–9D. This embodiment illustrates the versatility of power supply circuit 700. As best understood with reference to FIG. 10, capacitors 708 from a plurality of primary circuits 706 can be stacked together to be used in conjunction with one another to increase the charge storing capacity of power supply 700. The stacked capacitors 708 form a first rack 709. Each primary circuit 706 can be connected together upon the closing of switches or relays 707. As the capacity of the voltage is increased a plurality of capacitor racks, such as second rack 711 and third rack 713 can be connected in parallel with first rack 709 via a set of switches 714. The racks 709, 711, and 713 can be used together to vary the capacitance and thus the power level supplied to lamp 602.

FIG. 10 illustrates additional versatility of power supply 700. For example, AC power source 702 can be configured to provide a variable voltage, ranging for example between about 200 VAC and about 5000 VAC. In addition, resistor 704 of the primary circuit can be a halogen lamp or similar device, which can be used to dissipate heat energy and also provide a visual indication that the capacitor in the circuit is being charged or discharged.

Figure 11:
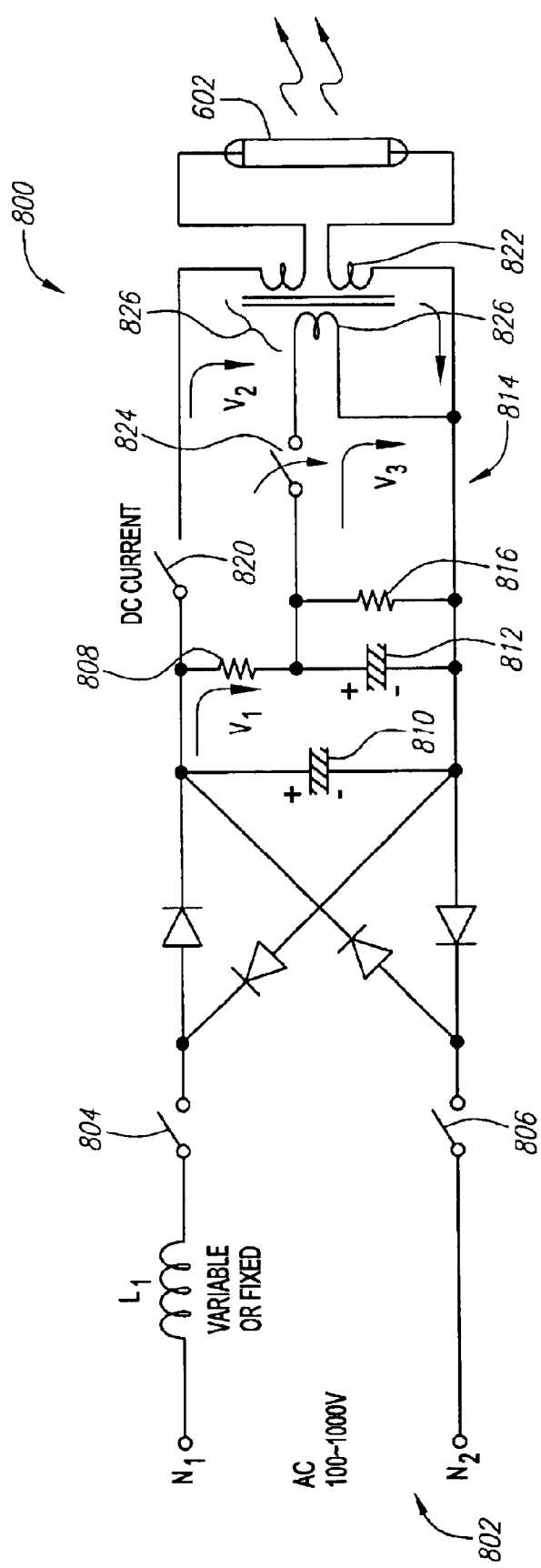
FIG. 11 is an embodiment of a power supply circuit in accordance with the principles of the present invention.

FIG. 11 is an embodiment of a power supply circuit 800 using the principles described in reference to FIGS. 9A–9D with the additional ability to allow a continuous powering of lamp 602. Accordingly, power supply circuit 800 can provide a flash exposure to the radiation energy of lamp 602 followed by a continuous component of exposure to the radiation energy of lamp 602. Power supply circuit 800 includes power circuit 802, where switches 804 and 806 when closed allow an AC supply voltage $V_1$ to be applied between nodes $N_1$ and $N_2$, to begin the charging via resistor 808 of capacitor 810. At the same time, capacitor 812 of ignition circuit 814 is charged via resistor 816. A set of diodes 818 are provided to convert the AC voltage supply to a DC voltage supply. When capacitors 810 and 812 are charged to desired capacities, switch 820 is closed allowing a voltage $V_2$ to be supplied from capacitor 810 across primary windings 822. Impulse switch 824 can be closed to allow capacitor 812 to discharge, such that a voltage $V_3$ is supplied across secondary windings 826. According to the transmission ratio of ignition transformer 826, a current flux generates a stepped-up voltage in primary windings 822 that is high enough to energize lamp 602. Once ignition switch 824 is released, voltage $V_2$ remains across the primary windings to allow lamp 602 to remain energized and, thus producing a radiation energy output. In this manner, discharge time can be controlled.

U.S. Pat. No. 6,376,806, commonly assigned to the assignee of the present invention, is herein incorporated by reference for all purposes.

Having thus described embodiments of the present invention, persons skilled in the art will recognize that changes may be made in form and detail without departing from the spirit and scope of the invention. Thus the invention is limited only by the following claims.

What is claimed is:

1. A method for forming a SOI structure, comprising:

providing a silicon substrate and a support substrate having a first surface and a second surface;

implanting an impurity into said silicon substrate to a first depth;

bonding said silicon substrate to said support substrate, wherein said impurity is adjacent to said first surface of said support substrate;

flashing said support substrate with radiation energy which is directional and impinges on the second surface of said support substrate for a substantially instantaneous time to go through said support substrate toward the first surface and heat the first depth of said silicon substrate to an annealing temperature.

2. The method of claim 1, wherein said radiation energy is derived from a radiation energy source comprising a high-intensity lamp.

3. The method of claim 2, wherein said high-intensity lamp comprises a Xe arc lamp.

4. The method of claim 1, wherein said support substrate comprises quartz.

5. The method of claim 1, wherein said radiation energy comprises an average power of between about 0.5 J/cm$^2$ and about 100 J/cm$^2$.

6. The method of claim 1, wherein said first depth comprises a portion of said silicon substrate between 10 nm and about 1 mm below a surface of said silicon substrate.

7. The method of claim 1, wherein said annealing temperature is between about 500° C. and 1400° C.

8. The method of claim 1, wherein said substantially instantaneous time is between about 1 nanosecond and about 10 seconds.

9. A method for forming an SOI structure, comprising:

providing a first substrate and a second substrate;

applying a layer of SiO$_2$ to said first substrate;

implanting an impurity through said layer of SiO$_2$ into said first substrate to a first depth;

bonding said first substrate to a first surface of said second substrate with said layer of SiO$_2$ disposed therebetween; and flashing, directionally, an opposing second surface of said second substrate to heat said first depth to an annealing temperature.

10. The method of claim 9, wherein said flashing comprises energizing a high-intensity lamp for a substantially instantaneous time.

11. The method of claim 10, wherein said substantially instantaneous time is between about 1 nanosecond and about 10 seconds.

12. The method of claim 9, wherein said second substrate comprises quartz.

13. The method of claim 9, wherein said second substrate comprises SiC, GaAs, GaP, InP, GaN, and Al$_2$O$_3$.

14. The method of claim 9, wherein said first depth comprises a portion of said first substrate between 10 nm and about 1 mm below a surface of said silicon substrate.

15. The method of claim 9, wherein said annealing temperature is between about 500° C. and 1400° C.

* * * * *